(12) United States Patent
Benjamin et al.

(10) Patent No.: US 7,571,697 B2
(45) Date of Patent: Aug. 11, 2009

(54) PLASMA PROCESSOR COIL

(75) Inventors: Neil Benjamin, Palo Alto, CA (US); David Cooperberg, Mount Kisco, NY (US)

(73) Assignee: Lam Research Corporation, Fremont, CA (US)

( * ) Notice: Subject to any disclaimer, the term of this patent is extended or adjusted under 35 U.S.C. 154(b) by 87 days.

(21) Appl. No.: 10/242,795

(22) Filed: Sep. 13, 2002

(65) Prior Publication Data

US 2003/0067273 A1 Apr. 10, 2003

Related U.S. Application Data

(60) Provisional application No. 60/322,581, filed on Sep. 14, 2001.

(51) Int. Cl.
*C23C 16/00* (2006.01)
*C23F 1/00* (2006.01)
*H01L 21/306* (2006.01)

(52) U.S. Cl. .............. 118/723 I; 156/345.48

(58) Field of Classification Search .............. 118/723 I, 118/723 IR, 723 AN; 156/345.48, 345.49; 315/111.51
See application file for complete search history.

(56) References Cited

U.S. PATENT DOCUMENTS

| | | | |
|---|---|---|---|
| 4,948,458 A | 8/1990 | Ogle | |
| 5,401,350 A * | 3/1995 | Patrick et al. | 156/345.48 |
| 5,525,159 A | 6/1996 | Hama et al. | |
| 5,558,722 A | 9/1996 | Okumura et al. | |
| 5,578,165 A | 11/1996 | Patrick et al. | |
| 5,589,737 A * | 12/1996 | Barnes et al. | 315/111.21 |
| 5,711,850 A | 1/1998 | Okumura et al. | |
| 5,716,451 A | 2/1998 | Hama et al. | |
| 5,731,565 A | 3/1998 | Gates | |
| 5,759,280 A | 6/1998 | Holland et al. | |
| 5,800,619 A | 9/1998 | Holland et al. | |
| 5,824,606 A * | 10/1998 | Dible et al. | 438/729 |
| 5,874,704 A | 2/1999 | Gates | |
| 5,919,382 A * | 7/1999 | Qian et al. | 219/121.52 |
| 5,975,013 A | 11/1999 | Holland et al. | |
| 6,027,603 A | 2/2000 | Holland et al. | |

(Continued)

FOREIGN PATENT DOCUMENTS

JP 9-82692 A 3/1997

(Continued)

OTHER PUBLICATIONS

Patent Abstracts of Japan, vol. 1998, No. 04, Mar. 31, 1998 & JP 09 319440 A (JEOL Ltd), Dec. 12, 1997 abstract.

*Primary Examiner*—Parviz Hassanzadeh
*Assistant Examiner*—Maureen Gramaglia
(74) *Attorney, Agent, or Firm*—Lowe Hauptman Ham & Berner LLP

(57) ABSTRACT

A plasma processor coil can include a shorting turn ohmically or only reactively coupled to plural multi-turn, co-planar, interleaved spiral, parallel connected windings. A separate capacitor can be associated with each winding to shunt current from one portion of that winding to another portion of the winding. The spacing between adjacent turns of peripheral portions of each winding can differ from the spacing between adjacent turns of interior portions of each winding. The coil can have a length that is short relative to the wavelength of RF excitation for the coil.

49 Claims, 9 Drawing Sheets

U.S. PATENT DOCUMENTS

| | | | |
|---|---|---|---|
| 6,028,285 | A | 2/2000 | Khater et al. |
| 6,028,395 | A | 2/2000 | Holland et al. |
| 6,164,241 | A | 12/2000 | Chen et al. |
| 6,184,488 | B1 | 2/2001 | Gates |
| 6,229,264 | B1 | 5/2001 | Ni |
| 6,268,700 | B1 | 7/2001 | Holland et al. |
| 6,297,468 | B1 | 10/2001 | Qian et al. |
| 6,297,583 | B1 * | 10/2001 | Kohne et al. ................. 313/161 |
| 2003/0106645 | A1 * | 6/2003 | Ni et al. ................. 156/345.48 |

FOREIGN PATENT DOCUMENTS

| | | |
|---|---|---|
| JP | 09319440 | 12/1997 |
| WO | WO 97/08734 | 3/1997 |

* cited by examiner

PLASMA PROCESSOR COIL

RELATION TO CO-PENDING APPLICATION

The present application is a continuation-in-part of the co-pending, commonly assigned provisional application Ser. No. 60/322,581, filed Sep. 14, 2001, entitled Galaxy TCP Coil.

FIELD OF INVENTION

The present invention relates generally to plasma processor coils. One particular aspect of the invention relates to such a coil, in combination with a circuit element, preferably a shorting turn, for substantially confining a magnetic field to one segment of the coil. An additional aspect of the invention relates to such a coil wherein the spacing between adjacent turns in a peripheral part of the coil differs from the spacing between adjacent turns in an inner portion of the coil. A further aspect of the invention relates to such a coil including a plurality of multi-turn windings connected in parallel to first and second excitation terminals of the coil, in combination with a separate circuit element connected to a pair of points on each of the windings, wherein the circuit element is of a type and has a value and connections for causing current flowing in different portions of the same winding to differ.

BACKGROUND ART

One type of processor for treating workpieces with an RF plasma in a vacuum chamber includes a coil responsive to an RF source. The coil responds to the RF source to produce magnetic and electric fields that excite gas in the chamber into a plasma. Usually, the coil is planar and is on or adjacent to an exterior face of a dielectric window that extends in a direction generally parallel to a planar horizontally extending surface of the processed workpiece. Alternatively and/or additionally, the coil has a dome shape and the window has a dome shape or is planar. The excited plasma interacts with the workpiece in the chamber to etch, modify or deposit material on the workpiece, i.e., to process the workpiece. The workpiece is typically a semiconductor wafer having a planar circular surface or a solid dielectric plate, e.g., a rectangular glass substrate used in flat panel displays, or a metal plate.

Ogle, U.S. Pat. No. 4,948,458, discloses a multi-turn spiral coil for achieving the above results. The spiral, which is generally of the Archimedes type, extends radially and circumferentially between its interior and exterior terminals connected to the RF source via an impedance matching network. Coils of this general type produce oscillating RF fields having both magnetic and electric field components that penetrate through the dielectric window to heat electrons in the gas in a portion of the plasma in the chamber close to the window. The oscillating RF fields induce in the plasma currents that heat electrons in the plasma. The spatial distribution of the magnetic field in the plasma portion close to the window is a function of the sum of individual magnetic field components produced by each turn of the coil and by other currents, including those induced in the plasma. The magnetic field component produced by each of the turns is a function of the magnitude of RF current in each turn which differs for different turns because of dissipation, impedance and transmission line effects along the coil at the frequency of the RF source.

For spiral designs as disclosed by and based on the Ogle '458 patent, the RF currents in the spiral coil are distributed to produce a torroidal shaped magnetic field region in the portion of the plasma close to the window, which is where power is absorbed by the gas to excite the gas to a plasma. At low pressures, in the 1.0 to 10 mTorr range, global diffusion of the plasma from the ring-shaped region produces a substantially uniform plasma density just above the workpiece At intermediate pressure ranges, in the 10 to 100 mTorr range, the plasma density has a tendency to peak above the center of the workpiece which is coaxial with the coil. At high pressure, above 100 mTorr, gas phase collisions of electrons, ions and neutrons in the plasma reduce diffusion of the plasma charged particles outside the torroidal production region. As a result, there is a relatively high plasma flux in a torroidal region that is coaxial with and above the workpiece but lower plasma fluxes above the center and peripheral workpiece portions.

These differing operating conditions result in substantially large plasma flux (i.e., plasma density) variations between the torroid and the volumes interior and exterior to it, resulting in a substantially non-uniform spatial distribution of the plasma flux incident on the workpiece. The substantially non-uniform spatial distribution of the plasma flux incident on the workpiece has a tendency to cause non-uniform workpiece processing, i.e., different portions of the workpiece are etched to different extents and/or have different amounts of molecules deposited on them.

Many coils have been designed to improve the uniformity of the plasma produced by the Ogle type coil, see, e.g., the following United States Patents: Hama, U.S. Pat. No. 5,525,159; Okumura et al., U.S. Pat. No. 5,558,722; Barnes et al., U.S. Pat. No. 5,589,737; Okumura et al., U.S. Pat. No. 5,711,850; Hama et al., U.S. Pat. No. 5,716,451; Gates, U.S. Pat. No. 5,731,565; Holland et al., U.S. Pat. No. 5,759,280; Qian et al., U.S. Pat. No. 5,919,382; Holland et al., U.S. Pat. No. 5,800,619; Gates, U.S. Pat. No. 5,874,704; Holland et al., U.S. Pat. No. 5,975,013; Holland et al., U.S. Pat. No. 6,027,603; Khater et al., U.S. Pat. No. 6,028,285; Gates, U.S. Pat. No. 6,184,488; Holland et al., U.S. Pat. No. 6,268,700; Ni et al., U.S. Pat. No. 6,229,264; Qian et al., U.S. Pat. No. 6,297,468; Chen et al., U.S. Pat. No. 6,164,241; and Holland et al., U.S. Pat. No. 6,028,395. In many of these prior art patents, the coil includes plural windings connected in parallel between a pair of excitation terminals of the coil. The plural windings in some of the patents are interleaved, substantially co-planar spirals extending radially and circumferentially between the first and second excitation terminals respectively at the innermost and outermost portions of the coil.

Despite this extensive work, improved results are still possible in attaining uniform plasma density on a workpiece in a coil excited vacuum plasma processing chamber. None of these patents consider isolating the fields originating in one portion of the coil from: (1) the fields originating in other portions of the coil, (2) a region within the innermost turn of each of the windings, or (3) a region outside the outermost turn of each of the windings. The configurations in most of these coils having plural windings connected in parallel between a pair of coil excitation terminals are such that the plasma density in the center of the workpiece is substantially higher than the plasma density at portions of the workpiece beyond the workpiece center. While Holland et al. in U.S. Pat. Nos. 5,800,619 and 5,975,013 discloses a metal disk in the center of a coil including plural interlaced (i.e., interleaved), substantially coplanar parallel spiral windings, the purpose of the Holland et al. metal disk is to isolate from the remainder of the coil the fields associated with current flowing in the leads that are connected between a matching network and the coil interior and exterior terminals.

Okumura et al., U.S. Pat. Nos. 5,558,722 and 5,711,850, disclose helical coils including plural helical discharge elements arranged circumferentially at equal intervals, such that both ends of the of the helical windings are connected to first and second annular coils that are respectively connected to a high frequency power source and ground. The '722 and '850 patents also disclose multiple spiral type coils including spiral discharge coil elements connected to an annular coil and a normal spiral coil connected outwardly from the annular coil. Apparently, a common terminal at the interior of the spiral discharge coil elements is connected to one output terminal of a matching network and the end of the normal spiral coil is connected to ground. In another configuration of the '722 patent there is a multiple spiral type coil having inner ends connected to an annular coil. A normal spiral coil is connected inwardly from the annular coil. Apparently, the end of the normal spiral coil at the center of the configuration is connected to one output terminal of a matching network and the ends of the multiple spiral type coils at the periphery of the configuration are grounded. The '722 patent does not indicate that the annular coils thereof perform any shielding or field isolation function. Indeed, there are substantial magnetic fields outside and within the helical coil configurations, as well as outside of and in the center of the spiral coil configurations of the '722 patent.

It is, accordingly, an object of the present invention to provide a new and improved coil for a vacuum plasma processor.

Another object of the invention is to provide for a vacuum plasma processor a new and improved coil having multiple windings connected in parallel between a pair of coil excitation terminals, wherein the coil is arranged so that RF fields originating in one part of the coil are substantially decoupled from other parts the coil and/or from regions within the innermost and/or beyond the outermost portions of the coil.

An additional object of the invention is to provide for a vacuum plasma processor a new and improved coil having multiple windings connected in parallel between a pair of coil excitation terminals, wherein turns of the windings are arranged so that magnetic fields coupled from different portions of the windings have different magnetic flux densities to assist in providing a workpiece processing plasma having a relatively uniform density.

A further object of the invention is to provide for a vacuum plasma processor a new and improved coil having multiple windings connected in parallel between a pair of coil excitation terminals, wherein circuit elements connected to the windings cause different portions of the windings to couple magnetic fields having different magnetic flux densities to the plasma to assist in providing a workpiece processing plasma having a relatively uniform density.

SUMMARY OF THE INVENTION

In accordance with one aspect of the invention, a coil for a plasma processor comprises (1) plural excitation terminals for connection to plural RF excitation circuitry output terminals, (2) a plurality of multi-turn windings connected in parallel to the coil excitation terminals, wherein each of the windings extends in generally radial and circumferential directions between inner and peripheral portions of the coil, and (3) an impedance element, preferably a shorting turn, for substantially preventing a magnetic field in one segment of the coil from being coupled to another region.

According to different embodiments of the invention, the shorting turn is located inside the innermost portion of the coil, or outside the outermost portion of the coil, or between interior and exterior portions of the coil. The shorting turn can be ohmically connected to windings of the coil connected to the coil excitation terminals or can float, i.e., be only reactively coupled to other parts of the coil. When the shorting turn is connected to the coil, the shorting turn is connected to similar parts of interleaved windings included in the coil. Connecting the shorting turn to the innermost turns of the coil substantially reduces a tendency for discharges within the innermost turn of the coil. The RF impedance of the shorting turn for the RF derived by the RF excitation circuitry is preferably such that the RF voltage is substantially the same at each of the similar parts of each of the windings connected to the turn.

A further aspect of the invention concerns a plasma processor comprising (1) first and second excitation terminals for connection to opposite first and second terminals of RF excitation circuitry, and (2) plural multi-turn windings connected in parallel between the first and second excitation terminals, wherein each of the windings extends in generally radial and circumferential directions between inner and peripheral portions of the coil and the spacing between adjacent turns of the portions of the windings close to and at the periphery of the coil is less than the spacing between adjacent turns of the portions of the windings close to and at the inner portion of the coil. Such an arrangement results in a reduction in the magnetic flux and plasma density in the center of a chamber where workpieces are processed.

Holland et al. U.S. Pat. Nos. 6,028,395 and 6,268,700 disclose plasma processor coils having plural spiral like windings connected in parallel between excitation terminals, wherein the windings have different pitches in different portions of the coils. However, the coils in these Holland et al. patents are not concerned with excessive magnetic and plasma fluxes in the centers of the coil and workpiece. Instead, the opposite is the case, that is, the coils in these Holland et al. patents are designed so that there are increases in the magnetic and plasma fluxes in the centers of the coil and workpiece. In these Holland et al. patents, the pitch of the windings in the center portion of the coil is tighter than the pitch of the windings in the peripheral portions of the coil.

An additional aspect of the present invention relates to a plasma processor coil comprising (1) first and second excitation terminals for connection to opposite first and second terminals of RF excitation circuitry, (2) a plurality of multi-turn windings connected in parallel between the first and second excitation terminals, wherein each of the windings extends in generally radial and circumferential directions between inner and peripheral portions of the coil, and (3) separate circuit elements respectively connected to a pair of points on each of the windings, wherein the separate circuit elements are of a type and have values and connections for causing current flowing in different portions of the same winding to differ. Typically, each circuit element comprises a capacitor connected in shunt across the innermost point of each winding and an intermediate point on each of the windings.

I also realize that Gates, U.S. Pat. No. 5,731,565, discloses a coil having a single winding with multiple turns, wherein inner turns of the single winding are shunted by an adjustable capacitor. The capacitor reduces the current that would otherwise flow through the inner turns. Changing the value of the capacitor varies the current flowing through the inner turns to vary the rate plasma is generated in an area of the chamber beneath the inner turns of the coil. However, because the arrangement of the '565 patent has only a single winding, the plasma density uniformity of the '565 patent is substantially less than what is achieved with circuit elements connected to plural windings connected in parallel between the coil excitation terminals. In addition, connecting circuit elements, such as capacitors, between more than one winding of a coil having plural windings has the advantage of greater control over the spatial relationship of the magnetic flux the coil provides to the plasma, resulting in greater control over the spatial relationship of the plasma density relative to the workpiece. For example, connecting the circuit elements between corresponding symmetrical points on each winding can cause a symmetrical change in the magnetic flux. If, however, a particular situation warrants an asymmetrical magnetic flux relationship, the circuit elements associated with different windings can be connected to points on the different windings having different spatial relationships from each other.

A further aspect of the invention relates to a plasma processor coil having plural multi-turn spiral windings connected in parallel to first and second coil excitation terminals, wherein the turns of each of the windings extend arcuately in generally radial and circumferential directions between inner and peripheral portions of the coil, and at least one of the windings has a plurality of pitches. In specific first and second embodiments, the pitch in an interior portion of the coil exceeds the pitch in an outer portion of the coil and vice versa. Preferably, the multi-turn windings are interleaved and each of the windings includes a plurality of abutting portions that are approximately Archimedes spirals having (1) different pitches, (2) substantially the same configuration, and (3) are symmetrical with respect to a center point of the coil. The different pitch Archimedes spirals can also be incorporated in coils having only one winding.

In preferred embodiments, first and second portions of the Archimedes spiral are respectively substantially represented in polar coordinates by $R=k_1\theta$ for $\theta$ from $\theta_1$ to an angle somewhat less than $\theta_2$, and $R=k_2\theta$ for $\theta$ equal to an angle somewhat more than $\theta_2$ to $\theta$ equal to $\theta_3$, where R is the radial distance of the winding from the center of the coil, $\theta$ is the angle around the winding in radians, $k_1 \neq k_2$, and R between the angle somewhat less than $\theta_2$ to the angle somewhat greater than $\theta_2$ is such that the slopes of the first and second portions at $\theta_2$ are the same, $\theta_1$ is a point on the winding less than $\theta_2$, typically close to the winding center and $\theta_3$ is a point on the winding greater than $\theta_2$, typically far from the winding center.

The above and still further objects, features and advantages of the present invention will become apparent upon consideration of the following detailed descriptions of several specific embodiments thereof, especially when taken in conjunction with the accompanying drawings.

DETAILED DESCRIPTION OF THE DRAWING

Figure 1:
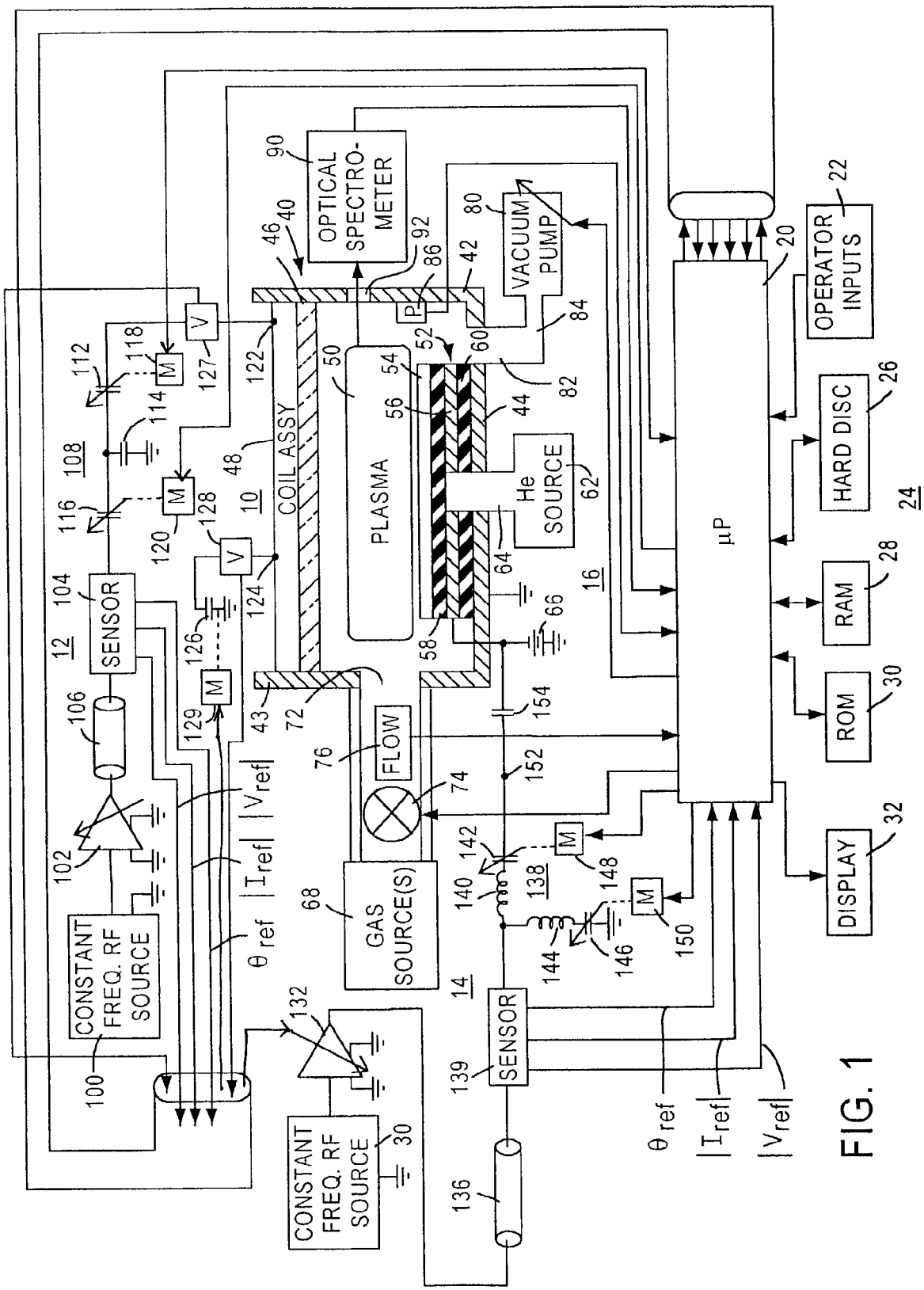
FIG. 1 is a schematic diagram of a vacuum plasma processor including coils of preferred embodiments of the present invention.

The workpiece processor illustrated in FIG. 1 includes vacuum plasma processing chamber assembly 10, excitation circuitry 12 for driving a coil for exciting gas in chamber assembly 10 to a plasma state, a second circuit 14 for applying RF bias to a workpiece holder in chamber assembly 10 and a controller arrangement 16 responsive to sensors for various parameters associated with chamber assembly 10 for deriving control signals for devices affecting the plasma in chamber assembly 10. Controller 16 includes microprocessor 20 which responds to various sensors associated with chamber 10 as well as circuits 12 and 14 and signals from operator inputs 22, which can be in the form, for example, of a keyboard. Microprocessor 20 is coupled with memory system 24 including hard disk 26, random access memory (RAM) 28 and read only memory (ROM) 30. Microprocessor 20 responds to the various signals supplied to it to drive display 32, which can be typical computer monitor.

Hard disk 26 and ROM 30 store programs for controlling the operation of microprocessor 20 and preset data associated with different recipes for the processes performed in chamber 10. The different recipes concern, inter alia, gas species and flow rates applied to chamber assembly 10 during different processes, the output power of RF sources included in circuits 12 and 14, the vacuum applied to the interior of chamber 10, and initial values of variable reactances included in matching networks of circuits 12 and 14.

Plasma chamber assembly 10 for processing workpiece 54 includes chamber 40 having metal, non-magnetic cylindrical side wall 42, non-magnetic metal shield collar 43 that extends above wall 42, and metal non-magnetic bottom plate 44, all of which are electrically grounded. Dielectric, typically quartz, window 46 is fixedly positioned between the top edge of wall 42 and collar 43. Wall 42, plate 44 and window 46 are rigidly connected to each other by suitable gaskets to enable a vacuum to be established within the interior of chamber 40. Coil assembly 48 comprises a planar plasma excitation coil including plural interleaved spiral windings that are connected in parallel. The coil of assembly 48 sits somewhat close to or on the upper face of window 46, i.e., outside chamber 40. Coil 46 reactively supplies magnetic and electric fields to the interior of chamber 40, to excite gas in the chamber to plasma, schematically illustrated in FIG. 1 by reference numeral 50.

The upper face of bottom plate 44 carries workpiece holder 52 for workpiece 54, which is typically a circular semiconductor wafer for the preferred embodiments of the coil of assembly 48. For other coil configurations, workpiece 54 can be a rectangular dielectric plate such as used in flat panel displays or a metal plate. Workpiece holder 52 typically includes a metal plate electrode 56 which carries dielectric layer 58 and sits on dielectric layer 60, which is carried by the upper face of base 44. A workpiece handling mechanism (not shown) places workpiece 54 on the upper face of dielectric layer 58. Workpiece 54 is cooled by supplying helium form a suitable source 62 to the underside of dielectric layer 58 via conduit 64 and grooves (not shown) in electrode 56. With workpiece 54 in place on dielectric layer 58, DC source 66 supplies a suitable voltage through a switch (not shown) to electrode 56 to clamp, i.e., chuck, workpiece 54 to holder, i.e., chuck, 52.

With workpiece 54 secured in place on chuck 52, one or more ionizable gases from one or more sources 68 flow into the interior of chamber 40 through conduit 70 and port 72 in sidewall 42. For convenience, only one gas source 68 is included in FIG. 1. Vacuum pump 80, connected to port 82 in base 44 of chamber 40 by conduit 84, evacuates the interior of the chamber to a suitable pressure, typically in the range of 0.1 to 1000 millitorr.

Excitation circuit 12 for driving coil 48 includes RF source 100, preferably having a frequency in the range of 2-4 MHz. The frequency of source 100 and the length of the windings of coil 48 are preferably such that each winding has a length less than about ⅛ of the wavelength of the source, so that there is no substantial transmission line effect in the winding and the voltage across and along each winding changes in a substantially linear manner. Source 100 drives variable gain power amplifier 102, typically having a power output of anywhere in the range between 100 and 3000 watts. In one implementation, amplifier 102 typically has a 50 ohm output impedance, all of which is resistive and none of which is reactive. Hence, the impedance seen looking back into the output terminals of amplifier 102 is typically represented by (50+j0) ohms.

For any particular recipe, memory system 24 stores a signal for desired output power of amplifier 112. Memory system 24 supplies the signal for desired output power of amplifier 102 to the amplifier by way of microprocessor 20. The output power of amplifier 102 can be controlled in an open loop manner in response to the signals stored in memory system 24 or control of the output power of amplifier 102 can be on a closed loop feedback basis.

The output power of amplifier 102 drives the coil of assembly 48, typically via cable 106 and matching network 108. Matching network 108 preferably has a "T" configuration, including two series legs respectively including variable capacitors 112 and 116, as well as a shunt leg including fixed capacitor 114. Coil assembly 48 includes input and output terminals 122 and 124, respectively connected to one electrode of capacitor 112 and to a first electrode of variable series capacitor 126, having a grounded second electrode. It is to be understood that terminal 124 can also be connected directly to ground or that terminals 122 and 124 can be driven by a secondary winding of a transformer having a primary winding driven by matching network 108. It is to be understood that the coil can be connected to an RF source by other arrangements, that may or may not include a conventional matching network.

The parallel windings of coil 48 are driven by the current flowing through terminals 122 and 124. The RF impedances of the windings are about (and preferably closely) the same so that current flowing through terminals 122 and 124 is divided about equally into the different windings. Controller 24 responds to signals derived by voltage probes 127 and 128, respectively connected to monitor the RF voltages at terminals 122 and 124. Controller 24 responds to the signals of probes 127 and 128 to control step motor 129 which varies the capacitance of capacitor 126 so that in the balanced mode of operation the RF voltages at terminals 122 and 124 have substantially the same magnitude, but opposite polarity.

Electric motors 118 and 120, preferably of the step type, respond to signals from microprocessor 20 to control the values of capacitors 112 and 116 in relatively small increments to maintain an impedance match between the impedance seen by looking from the output terminals of amplifier 102 into cable 106 and by looking from cable 106 into the output terminals of amplifier 102.

Circuit 14 for supplying RF bias to workpiece 54 via electrode 56 has a construction similar to circuit 12. Circuit 14 includes RF source 130, typically having a constant frequency such as 400 kHz, 2.0 MHz or 13.56 MHz. The constant frequency output of source 130 drives variable gain power amplifier 132, which in turn drives a cascaded arrangement including cable 136 and matching network 138. Motors 148 and 150 respectively vary the values of matching circuit capacitors 142 and 146 in response to signals from microprocessor 20.

Output terminal 152 of matching network 138 supplies an RF bias voltage to electrode 56 by way of series coupling capacitor 154 which isolates matching network 138 from the chucking voltage of DC source 66. The RF energy that circuit 14 applies to electrode 56 is capacitively coupled via dielectric layer 58, workpiece 54 and a plasma sheath between the workpiece and plasma to a portion of the plasma in close proximity with chuck 52. The RF energy chuck 52 couples to plasma 50 establishes a DC bias voltage in the plasma; the DC bias voltage typically has values between −50 and −1000 volts. The DC bias voltage resulting from the RF energy that circuit 14 applies to electrode 52 accelerates ions in plasma 50 to workpiece 54.

Microprocessor 20 responds to signals derived by circuits (not shown) included in sensor 134 to control motors 148 and 150 and the values of capacitors 142 and 146 in a manner similar to that described supra with regard to control of capacitors 112 and 116 of matching network 108. Accordingly, the circuits included in sensor 134 derive signals indicative of the current and voltage cable 136 reflects back to the output terminals of amplifier 132, as well as the phase angle between the reflected voltage and current.

Figure 2:
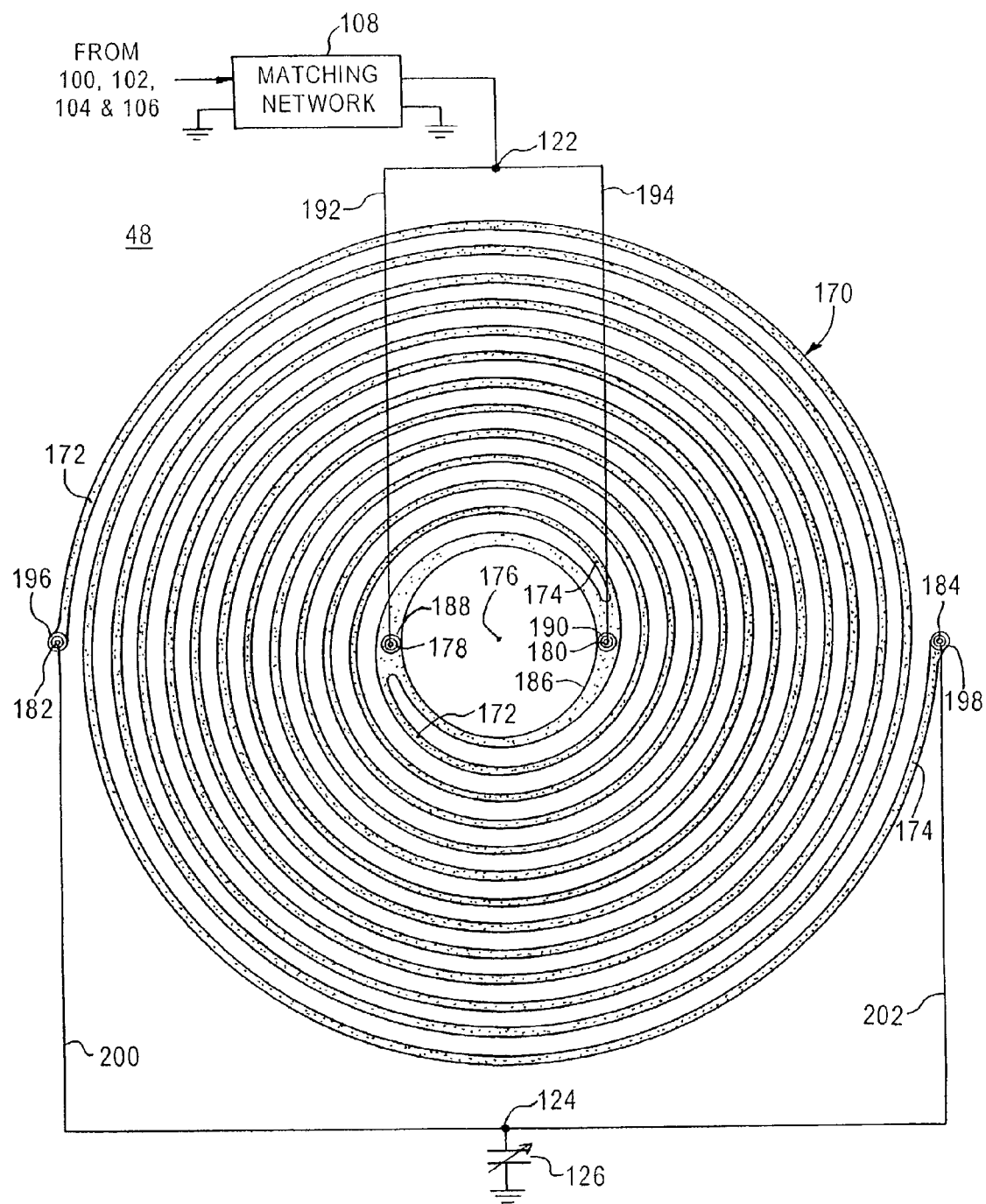
FIG. 2 includes a top view of a first embodiment of a coil in accordance with the present invention, wherein the coil includes a shorting turn ohmically connected to the innermost turns of windings of the coil.

Reference is now made to FIG. 2 of the drawing wherein coil assembly 48 is illustrated as comprising coil 170 including co-planar interleaved, multi-turn spiral, non-magnetic metal (e.g., copper) windings 172 and 174 which are symmetrically arranged with respect to coil center point 176. The innermost points 178 and 180 of windings 172 and 174, respectively, are spaced from center point 176 by a distance $R_0$ and are diametrically opposed. The outermost points 182 and 184 of windings 172 and 174, respectively, are spaced from center point 176 by a distance $R_1$ and are diametrically opposed, such that points 178, 180, 182 and 184 lie on a common line that intersects center point 176. Each of windings 172 and 174 is a six turn constant pitch Archimedes spiral that can be represented in polar coordinates by the equation $r=R_0+a\theta$, where r is the distance of any point on either spiral from center point 176, "a" is a constant related to the pitch of the spiral, and θ is the angle, in radians, from the innermost point of each spiral around that particular spiral; for each of the six turn spirals, θ is between 0 and 12π radians. because "a" is the same for all points along windings 172 and 174, (1) the radial distance between adjacent turns of winding 172 is the same, i.e., constant, (2) the radial distance between adjacent turns of winding 174 is constant, and (3) the radial distance between adjacent turns of windings 172 and 174 is constant that equals one-half of the radial distance between adjacent turns of winding 172 or winding 174.

The length of each of windings 172 and 174 is preferably short relative to the wavelength of constant frequency RF source 100, for example, no more than ⅛ of the source wavelength, so that there are no substantial transmission line effects in windings 172 and 174, resulting in substantially linear RF current and voltage variations along the lengths of windings 172 and 174. Consequently, the equivalent circuit of each of windings 172 and 174 is the series combination of a lumped inductor and a lumped resistor, rather than several sections formed by distributed parameter inductors, capacitors and resistors. Such a result occurs because the frequency of source 100 is relatively low, for example, in the 2-4 MHz range, even though the typical length of each of windings 172 and 174 is about 195 inches, resulting from spiral path length being equal to about $\pi(R_0+R_1)N$, where N (the number of turns of each winding) is 6 and $R_0$ and $R_1$ for each of windings 172 and 174 are respectively 2 and 8 inches.

Coil 170 also preferably includes a circular non-magnetic high conductivity metal (e.g., copper) RF shorting turn or ring 186 that, in the embodiment of FIG. 2, (1) is substantially co-planar with windings 172 and 174, (2) is coaxial with center point 176, (3) has a radius equal to $R_0$, and (4) is ohmically connected to the innermost points of windings 172 and 174. Shorting turn 186 (which can be considered as a circuit element) has a virtually negligible RF impedance, that is, an RF impedance much less than the substantially equal RF impedances of windings 172 and 174. Such a result can be attained by arranging the shorting turn so (1) its cross sections have perimeters equal to or greater than the perimeters of cross sections of windings 172 and 174, and (2) its length is considerably shorter than the substantially equal lengths of each of windings 172 and 174.

Turn 186 includes terminals 188 and 190, respectively coincident with and ohmically connected to innermost points 178 and 180 of windings 172 and 174, i.e. to similar or corresponding spatial segments of windings 172 and 174. Equal length, non-magnetic metal (e.g., copper) struts 192 and 194 electrically connect terminals 188 and 190 to terminal 122, in turn connected to the ungrounded output terminal of matching network 108 which is responsive to the RF output of source 100, as coupled to the matching network by amplifier 102, cable 106 and sensor 104. Consequently, struts 192 and 194 simultaneously supply RF voltages and currents having the same instantaneous amplitude and phase to terminals 188 and 190. The RF impedance of the shorting turn for the RF derived by the RF excitation circuitry is such that the RF voltage is substantially the same at corresponding angles of each of said windings. In other words, the instantaneous RF voltage and current of winding 172 at a point displaced from terminal 188 by angle $\theta_a$ are the same as the RF voltage and current of winding 174 at a point displaced from terminal 190 by angle $\theta_a$. Shorting turn 186 helps to reduce a tendency for arcing to occur to structures close to the coil center, i.e., inside turn 186, by creating an azimuthal equipotential region (i.e., an equal potential RF ring) and minimizing magnetic flux induction in the region inside turn 186.

The currents that terminals 188 and 190 respectively apply to windings 172 and 174 flow through the windings from the innermost points 178 and 180 of the windings to the outermost winding points 182 and 184. In response to the currents flowing in windings 172 and 174, magnetic fields are induced in the regions surrounding each of the turns of the windings. The induced magnetic fields are coupled to the gas in chamber 40 to cause excitation of plasma 50. Because of the relatively low voltage variations along the lengths of windings 172 and 174, the voltage differences between adjacent turns of the windings are not significant and there is a relatively low electric field coupled from the windings to the gas in chamber 40. Such electric field components can be further suppressed if desired by incorporating a floating or grounded electrostatic (i.e., Faraday) shield parallel to the plane of window 46.

Because struts 192 and 194 simultaneously supply RF voltages and currents having the same amplitude and phase to terminals 188 and 190 and the virtually negligible RF impedance of the shorting turn 186 there is substantial decoupling of RF magnetic fields that result from current flowing in windings 172 and 174 from the region within shorting turn 186. Consequently, the tendency for a high magnetic flux within the center of the spiral windings is substantially overcome, resulting in a substantially uniform plasma flux on circular workpiece 54, the central point of which is aligned with coil central point 176 during processing.

Outermost portions 182 and 184 of windings 172 and 174, respectively, are coincident with and connected to terminals 196 and 198. Equal length metal struts 200 and 202 electrically connect terminals 196 and 198 to terminal 124, which is in turn connected to the ungrounded electrode of variable capacitor 126, the other electrode of which is grounded, i.e., connected to a reference potential. The value of capacitor 126 is adjusted by motor 127 (FIG. 1) to maintain the relatively low voltages at terminals 122 and 124 substantially the same and to assist in resonating the frequency of source 100 with the load that the source drives. Because (1) struts 192, 194, 200 and 202 have equal lengths, (2) windings 172 and 174 have equal lengths and (3) windings 172 and 174 are symmetrical with respect to each other (i.e., are mirror images with respect to any line extending through central point 176 in the plane of windings 172 and 174), the voltages and currents at corresponding points of windings 172 and 174, i.e., points on the windings 172 and 174 at the same distance from terminals 178 and 180, simultaneously have the same amplitude and phase which differ only slightly from the amplitude and phase of the voltages and currents at terminals 188 and 190. Consequently, tendencies for arcing between the turns of windings 172 and 174 are substantially obviated.

Figure 3:
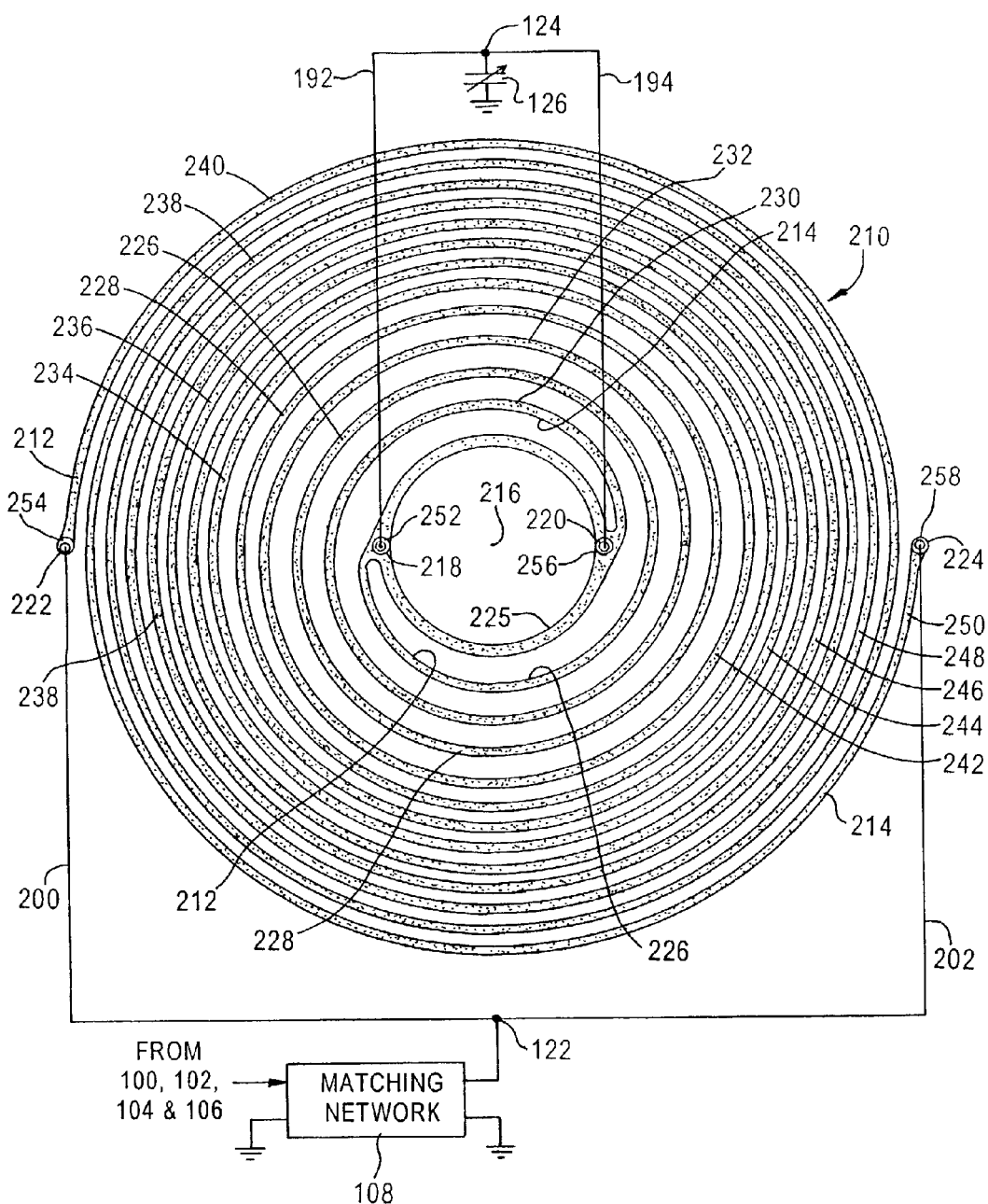
FIG. 3 includes a top view of a second embodiment of a coil in accordance with the present invention, wherein the coil includes spiral windings with turns having different pitches at different portions along the lengths of the windings.

Reference is now made to FIG. 3 of the drawing which includes a top view of a second embodiment of a coil of coil assembly 48. Coil 210, illustrated in FIG. 3, includes co-planar interleaved, multi-turn spiral non-magnetic metal windings 212 and 214, which are symmetrically arranged with respect to coil center point 216. The innermost points 218 and 220 of windings 212 and 214, respectively, are spaced from center point 216 by a distance $R_0$ and are diametrically opposed. The outermost points 222 and 224 of windings 212 and 214, respectively, are spaced from center point 216 by the distance $R_1$ and are diametrically opposed, such that points 216, 218, 220, 222 and 224 lie on a common line that intersects center point 216. (In the preferred embodiments, $R_0$ and $R_1$ for the coils of FIGS. 2 and 3 are the same.) Coil 210 also includes non-magnetic metal shorting ring 225, which is constructed substantially the same as, has the same attributes as, and performs the same functions as metal shorting ring 186, FIG. 2, and is ohmically connected to innermost points 222 and 224 of windings 212 and 214.

Each of windings 212 and 214 includes two abutting inner and outer segments, each of which is a multi-turn constant pitch Archimedes spiral. The inner portion of winding 212 includes two turns 226 and 228, and the inner portion of winding 214 includes two turns 230 and 232. The outer portion of winding 212 includes four turns 234, 236, 238 and 240, and the outer portion of winding 214 includes four turns 242, 244, 246, 248, and 250.

The spirals of each of windings 212 and 214 can be substantially represented in polar coordinates by the equations $r=R_0+b\theta$, for $\theta$ between 0 and an angle somewhat less than $4\pi$ radians, and $r=R_0+c\theta$, for $\theta$ between an angle somewhat more than $4\pi$ and $12\pi$ radians; where r is the distance of any point on either spiral from center point 216, "b" is a constant related to the pitch of the spiral in the inner segment of each of windings 212 and 214, that is, from $\theta=0$ to an angle somewhat less than $4\pi$ radians, "c" is a constant related to the pitch of the spiral in the outer segment of each of windings 212 and 214, that is, from θ having a value somewhat more than 4π to θ=12π radians, and θ is the angle, in radians, from the innermost point of each spiral around that particular spiral; for each of the six turn spirals of windings 212 and 214, 0≦θ≦12π radians. The value of b exceeds the value of c because the pitch of turns 226-232 is greater than the pitch of turns 234-250. Consequently, the radial distance between adjacent turns 226-232 is the same and greater than the equal radial spacing between adjacent turns 234-250.

In the region where the transition between the inner and outer portions of the windings occurs, i.e., where θ is somewhat less than 4π and somewhat greater than 4π, the shapes of windings 212 and 214 deviate from the substantial Archimedes spiral relation given by the equations so that the slopes of the abutting winding portions, at θ=4π, are the same. As a result, there is a smooth transition, without kinks, from turn 228 to turn 234 and a smooth transition without kinks from turn 230 to turn 242. The smooth transitions help to reduce the possibility of arcing between turns of the windings.

The length of each of windings 212 and 214 is preferably short relative to the wavelength of constant frequency RF source 100, for example, no more than ⅛ of the source wavelength, so that there are no substantial transmission line effects in windings 212 and 214, resulting in substantially linear current and voltage variations along the lengths of windings 212 and 214. Such a result occurs because the frequency of source 100 is relatively low, for example, 2-4 MHz, even though typical values of $R_0$ and $R_1$ of each of windings 172 and 174 are respectively 2 and 8 inches.

Because adjacent pairs of turns 226-232 are spaced from each other by a greater amount than the spacing between adjacent pairs of turns 234-250 and the instantaneous currents flowing in windings 212 and 214 are substantially the same throughout the windings, the magnetic flux density that turns 234-250 couple to the intermediate and peripheral portions of chamber 40 is greater than the magnetic flux density that turns 226-232 couple to the interior portion of the chamber. Hence, the different pitches of the inner and outer portions of windings 212 and 214 help to overcome the tendency for the magnetic flux density and plasma density in the center of chamber 40 to exceed the magnetic flux density and plasma density in the intermediate and exterior portions of chamber 40. The combination of the different pitches and shorting ring 225 is very effective for this purpose.

The innermost and outermost points 218 and 222 of winding 212 are coincident with and ohmically connected to terminals 252 and 254, respectively, while the innermost and outermost points 220 and 224 of winding 212 are coincident with and ohmically connected to terminals 256 and 258. Terminals 252 and 256 are respectively connected to equal length struts 192 and 194, which have a common connection to terminal 124, in turn connected to ground by variable capacitor 126 or via a direct connection. Terminals 254 and 258 are respectively connected to equal length struts 200 and 202, having a common connection to terminal 122 at the ungrounded output of matching network 108.

Figure 4:
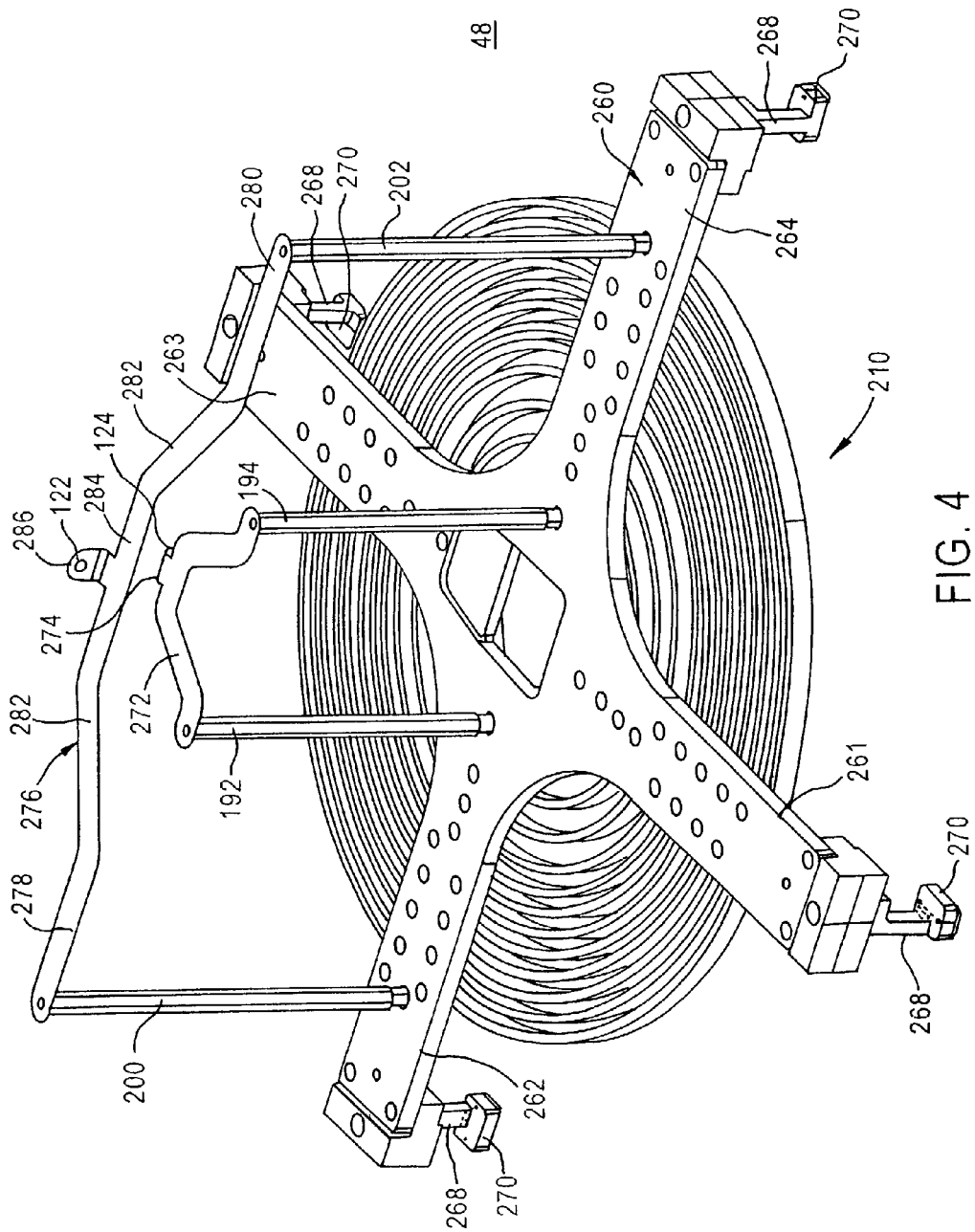
FIG. 4 is a perspective view of a coil assembly including the coil of FIG. 3.

Reference is now made to FIG. 4 the drawing, a perspective view of coil assembly 48 including coil 210, FIG. 3. Coil assembly 48 comprises a substantially planar, horizontally extending, electrically insulating, non-magnetic (e.g., lexan) support structure 260 including arms 261-264. Arms 261-264 extend at right angles with respect to each other and include fixed downwardly depending rods 266 that hold turns 226-250 in place so that the bottom edges of the turns are slightly above the upper face of window 46. Arms 261-264 of support structure 260 are symmetrically arranged with respect to the center of the support structure, which is vertically aligned with center point 216 of coil 210. Pedestals 268 downwardly depend from the outer ends of arms 261-264 and include feet 270 which bear against a horizontally extending flange (not shown) attached to wall 43 of chamber 40 to provide a stable support for coil assembly 48.

The inner portion of support structure 260 carries struts 192 and 194, which are formed as equal length, non-magnetic metal (e.g., copper) columns that are mechanically connected to the support structure and extend (1) downwardly through the support structure with electrical and mechanical connections to terminals 252 and 256 and (2) upwardly from the support structure. The columns forming struts 192 and 194 are equally spaced from the center of the support structure and are aligned with arms 262 and 264.

Substantially planar, horizontally extending non-magnetic metal ear 272 electrically and mechanically connects the upper ends of the columns forming struts 192 and 194 together. Ear 272 has a central portion that extends toward the end of arm 263 and away from the center of support structure 260 and includes a downwardly depending tab 274 that forms terminal 124 to which the ungrounded electrode of capacitor 126 is connected. Ear 272 and the columns forming struts 192 and 194 are constructed so that the distance between terminals 124 and 252 through the ear and the column forming strut 192 is equal to the distance between terminals 124 and 256 through the ear and the column forming strut 194. This construction assists in enabling the voltages and currents at terminals 252 and 256 to simultaneously have the same instantaneous values and phases.

The outer portions of arms 262 and 264 carries struts 200 and 202, which are formed as equal length metal columns that are mechanically connected to the support structure 260 and extend (1) downwardly through the arms with connections to terminals 254 and 258 and (2) upwardly from the arms. The columns forming struts 200 and 202 are equally spaced from the center of the support structure and are aligned with each other and with the columns forming struts 192 and 194.

Non-magnetic metal (e.g., copper) leg 276 electrically and mechanically connects the upper ends of the columns forming struts 200 and 202 together. Leg 276 includes two outer portions 278 and 280, two upwardly sloping portions 282 and a center horizontally extending portion 284, such that portions 278-284 are symmetrical with respect to the chamber vertical axis. The outer ends of leg portions 278 and 280 are respectively mechanically and electrically connected to the upper ends of the columns forming struts 200 and 202. Tab 286, which forms terminal 122, extends upwardly from the middle of horizontally extending portion 284 of leg 276. Leg 276 and the columns forming struts 200 and 202 are constructed so that the distance between terminals 122 and 254 through the leg and the column forming strut 200 is equal to the distance between terminals. 122 and 258 through the leg and the column forming strut 202. This construction assists in enabling the voltages and currents at terminals 254 and 258 to simultaneously have the same instantaneous values and phases.

The columns forming struts 192 and 194 are considerably shorter than the columns forming struts 200 and 202 so that ear 272 lies in a plane closer to the plane forming the top edge of coil 210 than any portion of leg 276. Consequently, there is a substantial separation between tabs 274 and 286 and, therefore, terminals 122 and 124, even though the tabs are generally aligned with the center portion of support structure 260. The foregoing location and position of tabs 274 and 286 assist in preventing cross coupling of the voltages and currents at terminals 122 and 124. Because the columns forming struts 192, 194, 200 and 202 extend vertically, that is, at right angles to the substantially horizontal direction of current flow in coil 210, the magnetic fluxes resulting from the currents flowing in the columns are substantially decoupled from the magnetic fluxes resulting from the current flowing in the coil.

It is to be understood that the support structure 260 and associated structures, such as the columns forming struts 192, 194, 200 and 202, and ear 272 and leg 276, as illustrated in FIG. 4 or structures very similar to those illustrated in FIG. 4, are preferably employed in connection with the coils illustrated in each of the embodiments of FIGS. 2 and 5-9 and that the structures illustrated in FIG. 4 are not limited to coil 210 of FIG. 3.

Figure 5:
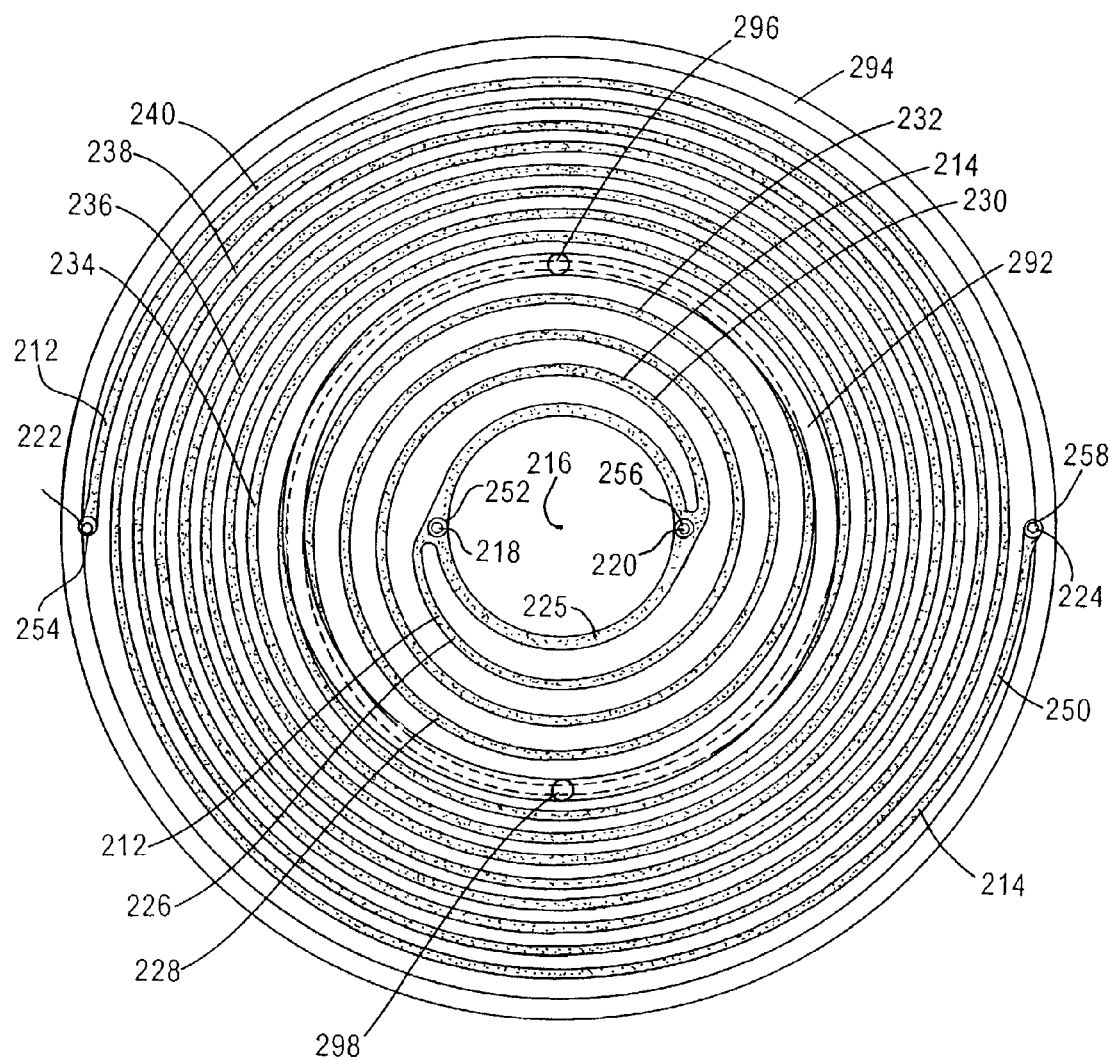
FIG. 5 includes a bottom view of a modification of the coil of FIG. 3, wherein the coil includes intermediate and peripheral shorting turns.
Figure 6:
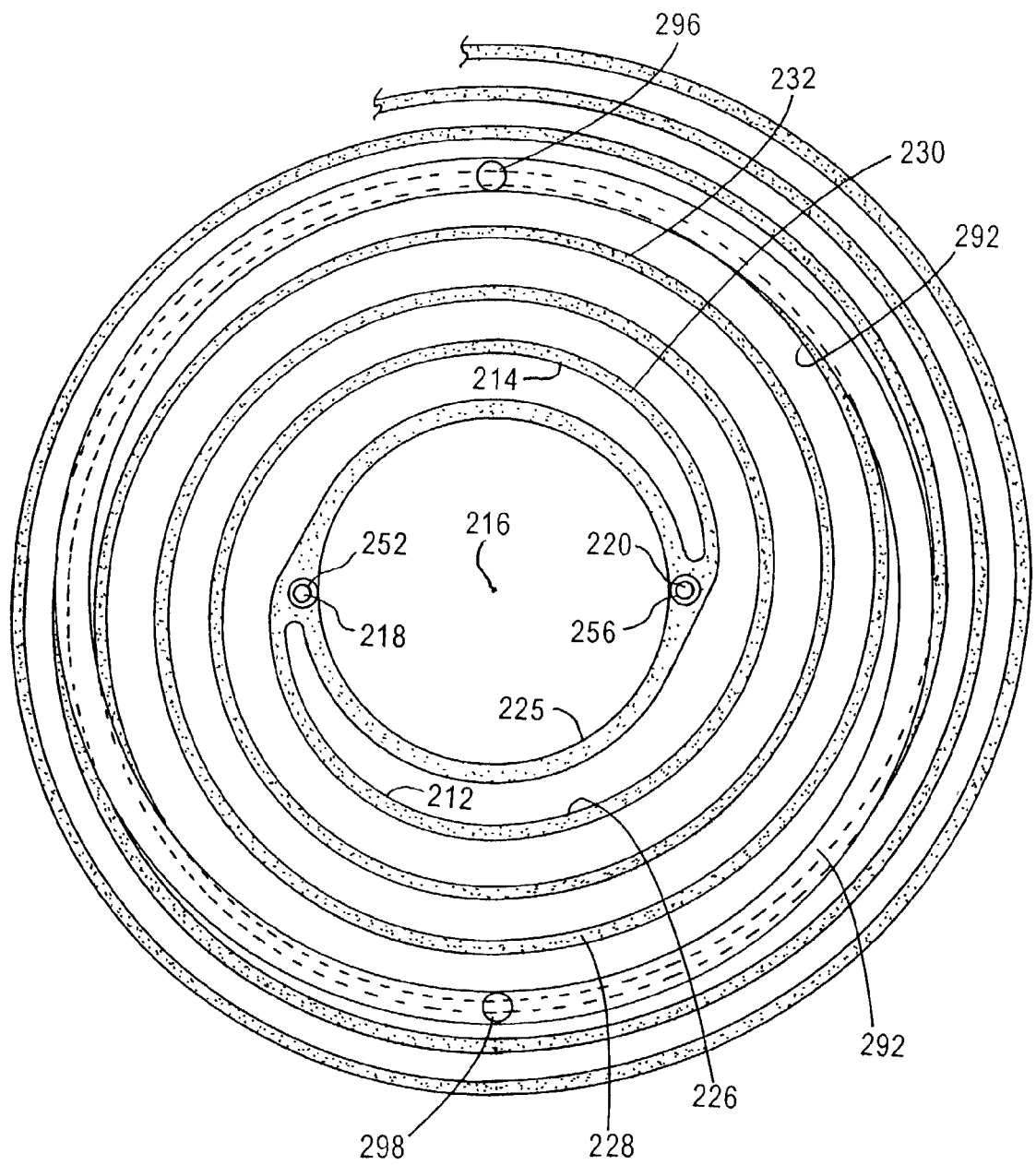
FIG. 6 is an enlarged bottom view of the center portion of the coil illustrated in FIG. 5.

Reference is now made to FIG. 5 of the drawing, a bottom view of coil 290, which is a modification of coil 210, FIG. 3. Because coil 290 includes all of the same parts as coil 210, the same reference numerals are used in conjunction with the drawings and descriptions of the two coils.

Coil 290 differs from coil 210 because coil 290 includes intermediate and peripheral non-magnetic, metal shorting turns or rings 292 and 294 (which can be considered as circuit elements), respectively. Shorting turn 292 is located, constructed and ohmically connected to the remainder of coil 290 so that RF magnetic fields coupled by the coil to the portion of chamber 40 inside shorting turn 292 are substantially isolated from RF magnetic fields coupled by the coil to the portion of chamber 40 outside shorting turn 292. Shorting turn 294 is located, constructed and connected to the remainder of coil 290 so that RF magnetic fields coupled by the coil to chamber 40 are decoupled, to a large extent, from the region beyond the periphery of chamber 40, to augment the shielding effects of shield 43.

Turns 292 and 294 are located between the bottom edge of the remainder of coil 290 and the upper face of dielectric window 46 to provide the stated magnetic field decoupling effect. In one arrangement, turns 292 and 294 are located in a substantially horizontal plane between the remainder of coil 290 and window 46. In this case, shorting turns 292 and 294 are (1) ohmically connected to the remainder of coil 290 by a pair of vertically extending non-magnetic metal posts (not shown) and (2) mechanically connected to the remainder of coil 290 by the metal posts, as well as by vertically extending electrical insulating posts (not shown); such metal and insulating posts are of equal length.

Alternatively, shorting turns 292 and 294 are ohmically connected to the remainder of coil 290 by the top faces of the shorting turns being metal bonded, e.g., by solder, to a pair of diametrically opposed points on the bottom faces of the spiral windings of the coil. In such a case there is a relatively smooth transition between shorting turns 292 and 294 and the spiral windings 212 and 214 of coil 290 at the points where they are electrically connected. To attain the smooth transition there are differing spacings in the vertical direction between shorting turns 292 and 294 and planar horizontally extending spiral windings 212 and 214, a result achieved by using different length, vertically extending insulating posts (not shown) to mechanically connect the shorting turns to the spiral windings.

Locating turns 292 and 294 in substantially horizontal planes has the advantage of mechanical simplicity. Turns 292 and 294 are preferably parallel to or in the plane of window 46 to avoid azimuthal asymmetry of (1) the magnetic field the coil couples to plasma 50 and (2) the plasma density.

Shorting turn 292 is shaped as a circular ring having a center coincident with center point 216 of coil 290. As illustrated in greater detail in FIG. 6, an enlarged bottom view of the inner portion of coil 290, turn 292 has a radius such that the circular shorting turn overlaps spiral turns 228 and 232 of windings 212 and 214, respectively.

Shorting turn 292 is ohmically connected to spiral turns 228 and 232 (as previously discussed) at points 296 and 298 on spiral turns 228 and 232 having the same instantaneous voltage and current amplitudes and phases, which points are at similar spatial segments of windings 212 and 214 of coil 290. The connection points 296 and 298 between shorting turn 292 and spiral turns 228 and 232 are diametrically opposite from each other. In the particular coil 290 illustrated in FIGS. 5 and 6, the connection point 296 of shorting turn 292 to spiral turn 228 is at the angle $7/2\pi$ radians from the innermost point 218 of winding 212, while the connection point 298 of shorting turn 292 to spiral turn 232 is at the angle $7/2\pi$ radians from the innermost point 220 of winding 214.

Shorting turn 292 has a virtually negligible RF impedance, that is, an RF impedance considerably less than the substantially equal RF impedances of windings 212 and 214, by virtue of the shorting turn preferably having a cross section with a perimeter equal to or greater than the cross-sectional perimeter of windings 212 and 214 (for example, twice as great) and a length considerably shorter than the substantially equal lengths of each of windings 212 and 214. Because the ohmic connections at points 296 and 298 simultaneously supply RF voltages and currents having the same instantaneous amplitude and phase to points 296 and 298 and the virtually negligible RF impedance of the shorting turn 292, there is substantial decoupling of RF magnetic fields that result from RF current flowing in windings 212 and 214 from the region within shorting turn 292 to the region outside the shorting turn, and vice versa. Consequently, the tendency for a high magnetic flux in the center of spiral windings 212 and 214 is further reduced, to further assist in providing a substantially uniform plasma flux on circular workpiece 54. It is be understood that an intermediate shorting turn, similar to shorting turn 292, can be located at any desired, appropriate position to tailor magnetic coupling from different regions of the coil to the interior of chamber 40, as desired.

Shorting turn 294 is shaped as a circular ring having a center coincident with center point 216 of coil 290 and a radius slightly in excess of the distance of outermost points 222 and 224 of windings 212 and 214 from the center point. Diametrically opposed points of shorting turn 294 are electrically connected to the diametrically opposed outermost points 222 and 224 (i.e., to similar spatial segments of windings 212 and 214 of coil 290) so that the voltages and currents supplied to the connection points of turn 294 by windings 212 and 214 have simultaneous instantaneous amplitude and phase. Shorting turn 294 also has a virtually negligible RF impedance, by virtue of the shorting turn having cross sections with a perimeter equal to or greater than the cross-sectional perimeter of windings 212 and 214 (for example, twice as great) and a length considerably shorter than the lengths of each of windings 212 and 214. Because the connections at points 222 and 224 simultaneously supply RF voltages and currents having the same instantaneous amplitude and phase to points 222 and 224 and the virtually negligible RF impedance of shorting turn 294, there is substantial decoupling of RF magnetic fields that result from current flowing in windings 212 and 214 from the region outside of shorting turn 294.

While coil 290 has been illustrated as including three shorting turns 225, 292 and 294, is be understood that in certain situations it may be desirable to employ only one or two, or more than three, shorting turns in a particular coil. In addition, under certain circumstances, it may be desirable for the shorting turn or turns to have a configuration other than a circle, for example, it may be desirable to employ an elliptical shorting turn, or a shorting turn shaped as a square or rectangle or any arbitrary shape optionally with connections to points on different windings of the coil simultaneously having voltages and currents at the same instantaneous amplitude and phase.

Figure 7:
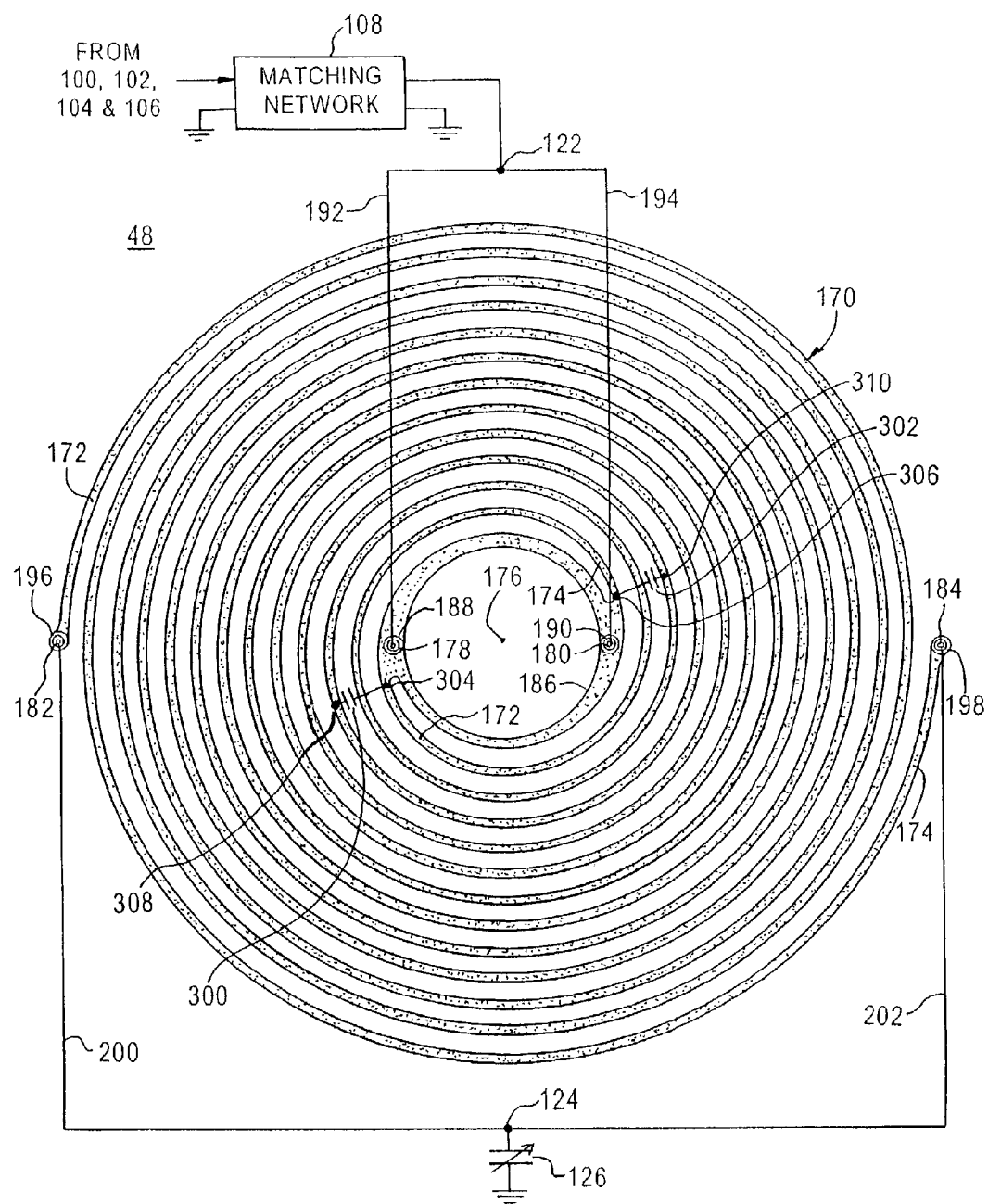
FIG. 7 is a top view of the coil of FIG. 2 in combination with a pair of symmetrically arranged capacitors.

Reference is now made to FIG. 7 of the drawing wherein coil 170, FIG. 2, is modified to include equal value circuit elements, that are preferably capacitors 300 and 302. Capacitors 300 and 302 enable coil 170, which has turns 172 and 174 with the same pitch throughout the lengths thereof, to couple to chamber 40 magnetic fields similar to the magnetic fields coupled to chamber 10 by coil 210, having turns 212 and 214 with different pitches. In general, corresponding electrodes of capacitors 300 and 302 are connected to corresponding, equal potential points on turns 172 and 174 to enable symmetrical fields to be coupled from the coil of FIG. 7 to plasma 50. In the particular configuration of FIG. 7, one electrode of capacitor 300 is connected to point 304 at the beginning of spiral winding 172, that is at $\theta=0$ radians, while one electrode of capacitor 302 is connected to point 306 at the beginning of spiral winding 174 also at $\theta=0$ radians. Points 304 and 306 are diametrically opposed to each other relative to center point 176 of coil 170. A second electrode of capacitor 300 is connected to point 308 at the beginning of the second turn of winding 172, that is, at $\theta=2\pi$ radians, while a second electrode of capacitor 302 is connected to point 310 at the beginning of the second turn of winding 174, that is, at $\theta=2\pi$ radians. Points 308 and 310 are diametrically opposed to each other relative to the coil center point 176. It is to be understood that (1) the second electrodes of capacitors 300 and 302 could be connected to corresponding points on windings 174 and 172 respectively, (2) the first electrodes of capacitors 300 and 302 can be connected to windings 172 and 174 at points other than $\theta=0$, and (3) the electrodes of the capacitors need not be connected to corresponding points on windings 172 and 174 if asymmetric fields are desirably coupled from the coil to plasma 50 because, e.g., such fields will assist in providing a more uniform plasma flux on workpiece 54.

Capacitors 300 and 302 shunt some of the current which otherwise would flow through the first turn of each of windings 172 and 174 and couple that current to the remaining turns of the windings. The symmetrical locations of the electrodes of capacitors 300 and 302 relative to coil center point 176, as well as the equal values of the capacitors and equal impedances of the first turns of the windings, cause approximately the same amount of current to flow in the first turns of windings 172 and 174. Consequently, the first turns of windings 172 and 174 couple substantially the same amount of magnetic flux to chamber 40. The sum of the currents that capacitor 300 and the first turn of winding 172 couple to the remaining turns of winding 172 is substantially equal to the sum of the currents capacitor 302 and the first turn of winding 174 supply to the remaining turns of winding 174. Because of the symmetrical connections of the second electrodes of capacitors 300 and 302 to the beginning of the second turns of windings 172 and 174 and the equal impedances of the remaining turns of the windings, the same amount of current flows in the remaining turns of windings 172 and 174. Consequently, the magnetic flux coupled by the first turn of each of windings 172 and 174 to chamber 40 by the coil of FIG. 7 is reduced relative to the magnetic flux coupled by the first turn of each of windings 172 and 174 by the coil of FIG. 2 to provide a magnetic flux pattern similar to that provided by the coil of FIG. 3.

Figure 8:
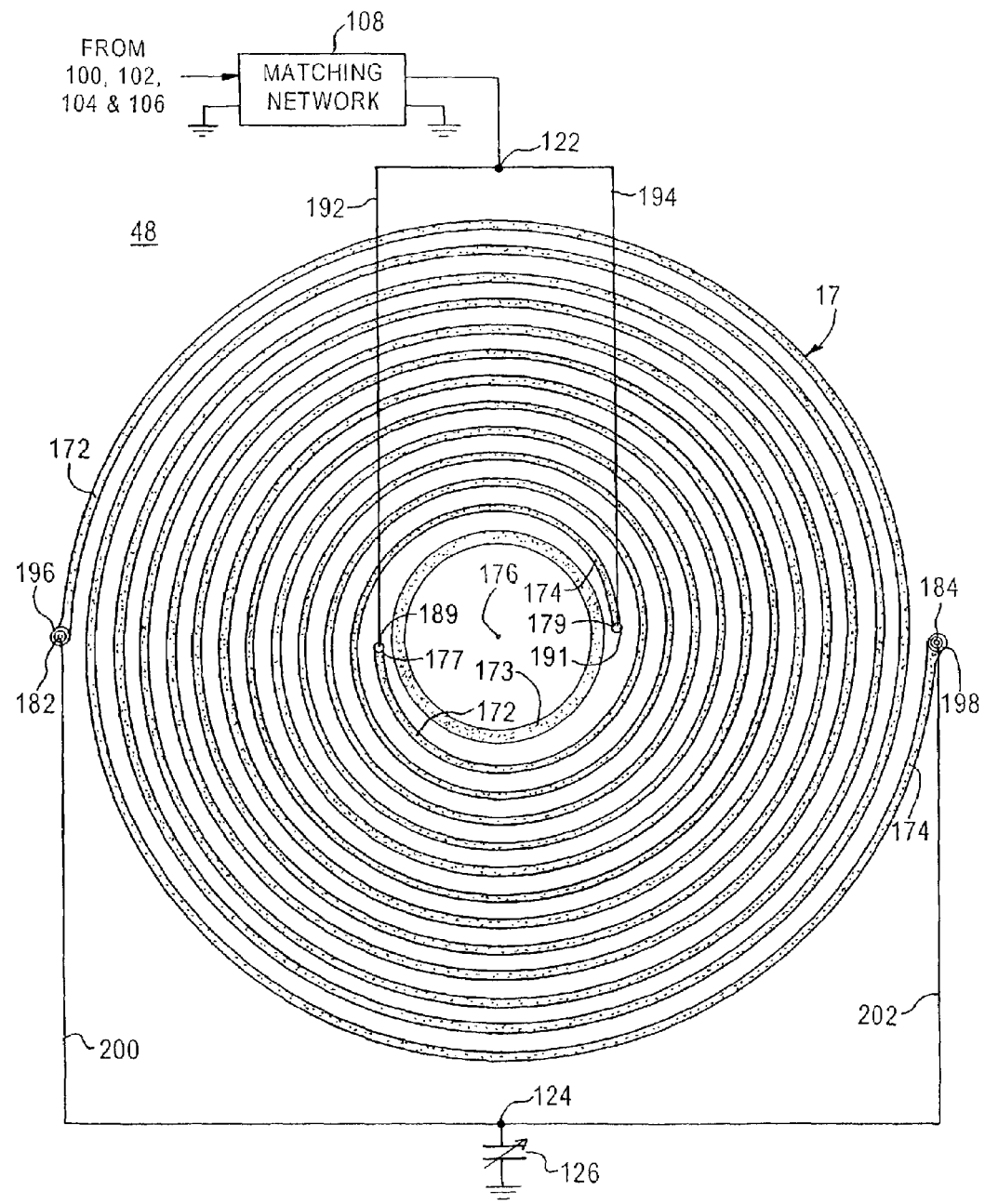
FIG. 8 includes a top view of a further embodiment of a coil in accordance with the present invention, wherein the coil includes a shorting turn only reactively coupled to the innermost turns of windings of the coil.

Reference is now made to FIG. 8, a top view of a coil 171 similar to the coil of FIG. 2. The coil of FIG. 8 includes central, circular, ring-shaped, nonmagnetic, metal shorting turn 173 that is coaxial with center point 176 and is only reactively coupled with the remainder of coil 171, i.e., there is no ohmic connection between shorting turn 173 and either of windings 172 and 174. Turn 173 has an outer diameter less than the spacing of the innermost points 177 and 179 on windings 173 and 174 from central point 176. Points 177 and 179 are diametrically opposed to each other and equidistant from the center point. Terminals 189 and 191 are coincident with points 177 and 179 and respectively connect struts 192 and 194 to points 177 and 179. Shorting turn 173 performs the same isolation or decoupling function as shorting turn 186 but does not cause possible, unequal current flows in windings 172 and 174. It is to be understood that the ohmically connected shorting rings illustrated in FIGS. 3 and 5-7, as well as FIG. 9, can be replaced by shorting rings that are only reactively coupled to the remainder of the coil. The degree of effective magnetic flux exclusion depends on the proximity of the shorting turn to (1) the window, (2) the remainder of the coil, and (3) the plasma; the proximity can be fixed or adjustable. The shorting turn can be placed (1) under the coil close to the window, or (2) above the coil, or (3) in the plane of the coil, depending upon the desired degree of isolation of the fields from one part of the coil to different regions of the plasma.

Figure 9:
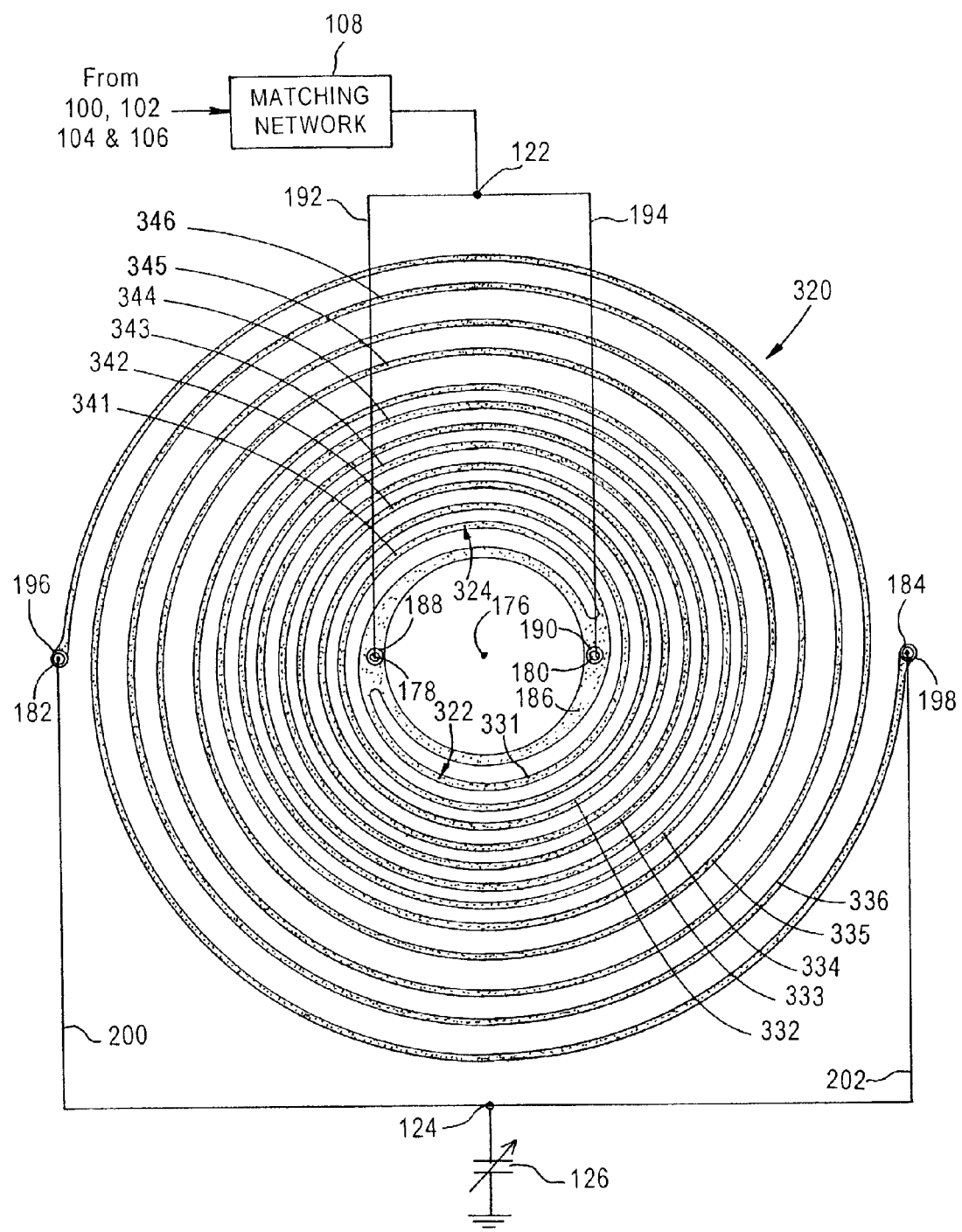
FIG. 9 is a top view of another embodiment of a coil in accordance with the present invention.

Reference is now made to FIG. 9 of the drawing which includes a top view of coil 320, another embodiment of a coil of coil assembly 48. Coil 320 includes co-planar interleaved, multi-turn spiral non-magnetic metal windings 322 and 324, which are symmetrically arranged with respect to coil center point 176. The innermost points 178 and 180 of windings 322 and 324, respectively, are spaced from center point 176 by a distance Ro and are diametrically opposed. The outermost points 182 and 184 of windings 322 and 324, respectively, are spaced from center point 176 by the distance $R_1$ and are diametrically opposed, such that points 176, 178, 180, 182 and 184 lie on a common line that intersects center point 176. (In the preferred embodiments, $R_0$ and $R_1$ for the coils of FIGS. 2, 3 and 9 are the same.) Coil 320 also includes non-magnetic metal shorting ring 186, which is constructed and ohmically connected substantially the same as, has the same attributes as, and performs the same functions as metal shorting ring 186, FIG. 2.

Each of windings 322 and 324 includes two abutting inner and outer segments, each of which is a multi-turn constant pitch Archimedes spiral. The inner portion of winding 322 includes four turns 331-334, and the inner portion of winding 324 includes four turns 341-344. The outer portion of winding 322 includes two turns 335 and 336, and the outer portion of winding 324 includes two turns 345 and 346.

The spirals of each of windings 322 and 324 can be substantially represented in polar coordinates by the equations $r=R_0+d\theta$, for $\theta$ between 0 and an angle somewhat less than $8\pi$ radians, and $r=R_0+e\theta$, for $\theta$ between an angle somewhat more than $8\pi$ and $12\pi$ radians; where r is the distance of any point on either spiral from center point 216, "d" is a constant related to the pitch of the spiral in the inner segment of each of windings 322 and 324, that is, from $\theta=0$ to the angle somewhat less than $8\pi$ radians, "e" is a constant related to the pitch of the spiral in the outer segment of each of windings 322 and 324, that is, from $\theta$ having a value somewhat more than $8\pi$ to $\theta=12\pi$ radians, and $\theta$ is the angle, in radians, from the innermost point of each spiral around that particular spiral; for each of the six turn spirals of windings 322 and 324, $0 \leq \theta \leq 12\pi$ radians. The value of e exceeds the value of d because the pitch of turns 331-334 and 341-344 is greater than the pitch of turns 335, 336, 345 and 346. Consequently, the radial distance between adjacent turns 335, 336, 345 and 346 is the same and greater than the equal radial spacing between adjacent turns 331-334 and 341-344.

In the region where transition between the inner and outer portions of the windings occurs, i.e., where θ is somewhat less than 8π and somewhat greater than 8π, the shapes of windings 322 and 324 deviate from the substantial Archimedes spiral relation given by the equations so that the slopes of the abutting winding portions are the same. As a result, there is a smooth transition, without kinks from turn 334 to turn 335 and a smooth transition without kinks from turn 344 to turn 345. The smooth transition helps to provide uniform magnetic flux coupling to the plasma and reduced likelihood of arcing between the turns of the windings.

The length of each of windings 322 and 324 is short relative to the wavelength of constant frequency RF source 100, for example, no more than ⅛ of the source wavelength, so that there are no substantial transmission line effects in windings 322 and 324, resulting in substantially linear current and voltage variations along the lengths of windings 322 and 324. Such a result occurs because the wavelength that source 100 supplies to the coil is relatively long relative to the length of each of windings 322 and 324. For example, the frequency of source 100 is in the 2-4 MHz range (so the source has a free space wavelength of about 100 meters) and the length of each of windings 172 and 174 is about five meters.

Because adjacent pairs of turns 335, 336, 345 and 346 are spaced from each other by a greater amount than the spacing between adjacent pairs of turns 331-334 and 341-344 and the instantaneous currents flowing in windings 322 and 324 are substantially the same throughout the windings, the magnetic flux density that turns 331-334 and 341-344 couple to the interior and intermediate portions of chamber 40 is greater than the magnetic flux density that turns 335, 336, 345 and 346 couple to the exterior portion of the chamber. Hence, the different pitches of the inner and outer portions of windings 322 and 324 help to overcome a tendency for the magnetic flux density and plasma density in the center and intermediate portions of chamber 40 to be less than the magnetic flux density and plasma density in the exterior portions of chamber 40.

The innermost and outermost points 178 and 182 of winding 322 are coincident with and electrically connected to terminals 188 and 196, respectively, while the innermost and outermost points 180 and 184 of winding 324 are coincident with and electrically connected to terminals 190 and 198. Terminals 188 and 190 are respectively connected to equal length struts 192 and 194, which have a common connection to terminal 122, connected by variable capacitor 126 to ground at the ungrounded output of matching network 108. Terminals 196 and 198 are respectively connected to equal length struts 200 and 202, having a common connection to terminal 122.

While there have been described and illustrated specific embodiments of the invention, it will be clear that variations in the details of the embodiments specifically illustrated and described may be made without departing from the true spirit and scope of the invention as defined in the appended claims. For example, the shorting turn can be employed in coils having only one winding. Also, the number of turns can be increased or decreased as necessary and the ohmic connection points to the shorting turns at the innermost portion of a coil having plural parallel windings can differ from those specifically illustrated, as long as the ohmic connection points are substantially diametrically opposed to each other; for example, the ohmic connection points to shorting turn 186 can be at right angles to the connection points illustrated in FIGS. 2, 3, 5-7 and 9. In addition, it is usually immaterial as to whether the matching network high voltage RF output terminal is connected to the outermost or innermost points of the coil. It is also to be understood that the coils can include more than two excitation terminals which can be connected to different RF output terminals. For example, a first RF output terminal of a first matching network can be connected in parallel to terminals 252 and 256 of interior ring 225, FIG. 3, and a second output terminal of the first matching network can be connected in parallel to posts 296 and 298; a first output terminal of a second matching network can be connected in parallel to posts 296 and 298, and a second output terminal of the second matching network can be connected in parallel to terminals 254 and 258. Hence, the terminology "first and second excitation terminals" in the claims merely means the coil has at least two excitation terminals and does not limit the coil to having only two excitation terminals. It is also understood that the single ended matching network having a grounded RF output terminal can be replaced by a matching network having push-pull output terminals connected to the opposite coil excitation terminals, in which case capacitor 120 is not employed. It is also to be understood that the number of interlaced spiral windings can be greater than two and that the interior terminals of the windings, at radius $R_1$ from the coil center, are preferably spaced from each other by 2π/N radians and the exterior terminals of the windings at radius $R_2$ are preferably spaced from each other by 2π/N radians, where N is the number of windings in the coil. If the coil has more than two windings and impedance elements such as capacitors 300 and 302 are employed, the number of such impedance elements is usually correspondingly increased. It is also to be understood that multiple impedance elements, such as capacitors 300 and 302, can be coupled in shunt with different portions of each winding to control the currents flowing in each different portion of each winding. The multiple impedance elements enable different currents to flow in the different winding portions to control the field intensity the different winding portions couple to different regions of the plasma. The values of the multiple impedance elements coupled to each winding are preferably selected and/or are computer controlled so that the impedance of the coil, as seen by looking into the coil excitation terminals and detected in response to output signals of known sensors, remains about the same for all different spatial configurations of the impedance elements. It is also to be understood that many of the principles of the invention are applicable to (1) variable frequency RF sources and that the RF source and matching network (i.e., tuning components) can be located in direct proximity to each other and the processor chamber, to obviate the need for a long cable between the RF source, and (2) to environments that are not based on 50+j0 output impedances.

We claim:

1. A coil for a plasma processor, the coil comprising excitation terminals for connection to opposite first and second terminals of RF excitation circuitry, at least one winding connected to said first and second excitation terminals, and a shorting turn coupled to the at least one winding, the at least one winding extending in generally radial and circumferential directions between inner and peripheral portions of the coil, the at least one winding having an inner most portion directly connected to the first excitation terminal, and the turn being coupled to the innermost portion of the coil.

2. The coil of claim 1 wherein the at least one winding extends in generally radial and circumferential directions between inner and peripheral portions of the coil, and the second excitation terminal being at the exterior portion of the coil.

3. The coil of claim 2 wherein the coil includes plural multi-turn windings arranged to be connected in parallel to said first and second terminals of the RF excitation circuitry.

4. The coil of claim 3 wherein said multi-turn windings are interleaved spirals.

5. The coil of claim 4 wherein the RF impedance of the shorting turn for the RF derived by the RF excitation circuitry is such that the RF voltage is substantially the same at corresponding angles of each of said windings.

6. The coil of claim 4 wherein the spacing between adjacent turns of each of the windings differs.

7. The coil of claim 6 wherein the spacing between adjacent turns of the portions of the windings in a peripheral portion of the coil differs from the spacing between adjacent turns of the portions of the windings in an inner portion of the coil.

8. The coil of claim 7 wherein the spacing between adjacent turns of each of the windings is less in the peripheral portion than in the inner portion.

9. The coil of claim 7 wherein the spacing between adjacent turns of each of the windings is greater in the peripheral portion than in the inner portion.

10. The coil of claim 3 further including a separate circuit element having opposite ends coupled to different points on the windings, the separate circuit element (a) being of a type, (b) having a value and (C) having connections for causing current flowing in different portions of the same winding to differ.

11. The coil of claim 10 wherein each of the circuit elements comprises a capacitor ohmically connected between corresponding equal potential points on the windings.

12. The coil of claim 3 wherein the shorting turn and the inner most portion of the coil windings are radially displaced from a center point of the coil.

13. The coil of claim 1 wherein the shorting turn is ohmically connected to the at least one winding.

14. The coil of claim 1 wherein the coil includes plural multi-turn windings arranged to be connected in parallel to said terminals of the RF excitation circuitry, and each of the windings extends in generally radial and circumferential directions between the inner most portion and peripheral portions of the coil and the shorting turn is ohmically connected to similar spatial segments of each of said windings.

15. The coil of claim 14 wherein the shorting turn and the inner most portion of the coil windings are radially displaced from a center point of the coil.

16. The coil of claim 15 wherein the inner most portion of the different windings have excitation terminals that are spaced from each other and the center of the coil.

17. The coil of claim 1 wherein the shorting turn is only reactively coupled with other parts of the coil.

18. The coil of claim 1 in combination with a plasma processor including the RF excitation circuitry and a vacuum chamber arranged for processing a workpiece with plasma, the vacuum chamber having a window, the coil being mounted outside the chamber in proximity to the window for coupling magnetic fields through the window to the chamber interior, the RF excitation circuitry having opposite first and second terminals connected to first and second of the excitation terminals.

19. The combination of claim 18 wherein the RF excitation circuitry includes a matching circuit and a capacitor, the matching circuit having an ungrounded terminal forming the first terminal of the RF excitation circuitry and connected to a first of said excitation terminals, the capacitor having a first electrode connected to a second of said excitation terminals and a second electrode connected to the second terminal of the RF excitation circuitry.

20. The combination of claim 19 wherein the RF excitation circuitry includes an RF source having first and second output terminals connected to an input terminal of the matching circuit and a grounded output terminal forming the second terminal of the RF excitation circuitry, the RF source having a frequency and each of the windings having a length such that the RF voltage and current along the length of each of the windings between first and second of the excitation terminals respectively arranged to be connected to the first and second terminals of the excitation circuitry vary in a substantially linear manner.

21. The combination of claim 20 wherein the length of each of the windings between the first and second excitation terminals is no longer than about ⅛ of a wavelength of the RF source frequency.

22. The combination of claim 19 wherein the capacitor has a value such that the RF voltages of first and second excitation terminals respectively arranged to be connected to the first and second terminals of the excitation circuitry are substantially the same.

23. The combination of claim 19 further including a sensor arrangement and a controller for the value of the capacitor.

24. The combination of claim 23 wherein the controller is arranged to respond to the sensor arrangement for maintaining the RF voltage magnitudes of first and second excitation terminals respectively arranged to be connected to the first and second terminals of the excitation circuitry to be substantially the same.

25. The combination of claim 18 wherein the RF circuitry includes an RF source, the RF source having a frequency and each of the windings having a length such that the RF voltage and current along the length of each of the other windings between first and second of the excitation terminals respectively arranged to be connected to the first and second terminals of the excitation circuitry vary in a substantially linear manner.

26. The combination of claim 25 wherein the length of each of the windings between the first and second excitation terminals is no longer than about ⅛ of a wavelength of the RF source frequency.

27. The coil of claim 1 wherein the coil includes plural multi-turn windings arranged to be connected in parallel to said terminals of the RF excitation circuitry, each of said windings extending in generally radial and circumferential directions between the inner most portion and outer portions of the coil, the coil having a center point and the windings being substantially co-planar, the innermost portion of each of the windings being spaced by about the same distance from the coil center point and an outermost portion spaced by about the same distance from the coil center point.

28. The coil of claim 27 wherein the shorting turn surrounds the coil center point.

29. The coil of claim 28 wherein the shorting turn is formed as a ring having a center substantially coincident with the center point of the coil.

30. The coil of claim 29 wherein the windings are substantially symmetrical with respect to the center point of the coil.

31. The coil of claim 28 wherein the shorting turn is substantially co-planar with the windings.

32. The coil of claim 1 wherein the shorting turn is substantially co-planar with the at least one winding.

33. The coil of claim 1 wherein the shorting turn is not co-planar with the at least one winding.

34. A coil for a plasma processor, the coil comprising excitation terminals for connection to opposite first and second terminals of RF excitation circuitry, a plurality of multi-turn windings arranged to be connected in parallel to said first and second terminals of the RF excitation circuitry, each of said windings extending in generally radial and circumferential directions between inner and peripheral portions of the coil, the inner most portion of each winding including an excitation terminal directly connected to the first terminal of the RF excitation terminal and being radially displaced from a center portion of the coil, and a circuit element coupled to at least some of the multi-turn windings for decoupling fields originating in a segment of the coil from a region in the immediate vicinity of or within the coil, the region in the immediate vicinity of the coil being inside the innermost portion of the coil.

35. The coil of claim 34 wherein the circuit element comprises a shorting turn.

36. The coil of claim 35 wherein the RF impedance of the shorting turn for the RF derived by the RF excitation circuitry is such that the RF voltage is the same at each of the similar segments.

37. The coil of claim 35 wherein the shorting turn and the inner most portion of the coil windings are radially displaced from a center point of the coil.

38. The coil of claim 37 wherein the inner most portion of the different windings have excitation terminals that are spaced from each other and the center of the coil.

39. The coil of claim 34 wherein the circuit element is ohmically connected to similar spatial segments of at least some of the multi-turn windings.

40. The coil of claim 34 wherein the circuit element is only reactively coupled with other parts of the coil.

41. A coil for a plasma processor, the coil comprising excitation terminals for connection to opposite first and second terminals of RF excitation circuitry, a plurality of multi-turn windings arranged to be connected in parallel between said first and second terminals of the RF excitation terminals, each of said windings extending in generally radial and circumferential directions between inner and peripheral portions of the coil, the spacing between adjacent turns of the portions of the windings at a peripheral region of the coil being less than the spacing between adjacent turns of the portions of the windings at an inner region of the coil, a shorting turn coupled to a similar spatial segment of each of the windings, the shorting turn being in substantially the same plane as the similar spatial segment of each of the windings to which the turn is coupled.

42. The coil of claim 41 wherein first and second of the excitation terminals that are respectively arranged to be connected to the first and second terminals of the excitation circuitry are respectively at the interior and exterior portions of the coil.

43. The coil of claim 42 wherein each of said multi-turn windings includes an Archimedes spiral configuration.

44. The coil of claim 43 wherein said multi-turn windings are interleaved with each other.

45. The coil of claim 44 wherein each of said multi-turn windings includes first and second abutting Archimedes spiral configurations having different pitches.

46. The coil of claim 41 wherein each of said multi-turn windings includes first and second abutting Archimedes spiral configurations having different pitches.

47. The coil of claim 41 in combination with a plasma processor including the RF excitation circuitry and a vacuum chamber arranged for processing a workpiece with plasma, the vacuum chamber having a window, the coil being mounted outside the chamber in proximity to the window for coupling magnetic and electric fields through the window to the chamber interior, the RF excitation circuitry opposite first and second terminals being connected to said first and second excitation terminals.

48. The coil of claim 41 wherein the shorting turn and the inner most portion of the coil windings are radially displaced from a center point of the coil.

49. The coil of claim 48 wherein the inner most portion of the different windings have excitation terminals that are spaced from each other and the center of the coil.

* * * * *